(12) United States Patent
Wangler et al.

(10) Patent No.: US 6,285,443 B1
(45) Date of Patent: Sep. 4, 2001

(54) ILLUMINATING ARRANGEMENT FOR A PROJECTION MICROLITHOGRAPHIC APPARATUS

(75) Inventors: Johannes Wangler, Königsbronn; Gerhard Ittner, Oberkochen, both of (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 09/315,267

(22) Filed: May 20, 1999

Related U.S. Application Data

(63) Continuation of application No. 08/658,605, filed on Jun. 5, 1996, now abandoned, which is a continuation-in-part of application No. 08/355,157, filed on Dec. 8, 1994, now Pat. No. 5,646,715.

(30) Foreign Application Priority Data

Dec. 13, 1993 (DE) ................................. 43 42 424
Jun. 17, 1994 (DE) ................................. 94 09 744
Jun. 6, 1995 (DE) ................................. 195 20 563

(51) Int. Cl.[7] ........................ G03B 27/54; G03B 27/42; G03B 27/72
(52) U.S. Cl. .................... 355/67; 355/53; 355/71
(58) Field of Search .................. 355/53, 67–71; 359/618, 569, 575

(56) References Cited

U.S. PATENT DOCUMENTS

| | | | |
|---|---|---|---|
| 4,939,630 | 7/1990 | Kikuchi et al. | 362/268 |
| 5,237,367 | 8/1993 | Kudo | 355/67 |
| 5,359,388 | 10/1994 | Hollman | 355/53 |
| 5,386,266 | 1/1995 | Kang | 355/67 |
| 5,631,721 | 5/1997 | Stanton et al. | 355/71 |
| 5,636,003 | 6/1997 | Tanitsu et al. | 355/67 |
| 5,646,715 | 7/1997 | Wangler | 355/67 |
| 5,675,401 | 10/1997 | Wangler et al. | 355/67 |

FOREIGN PATENT DOCUMENTS

| | | |
|---|---|---|
| 41 24 311 | 1/1993 | (DE) . |
| 9409744 | 10/1994 | (DE) . |
| 0312341 | 4/1989 | (EP) . |
| 0 486 316 | 5/1992 | (EP) . |
| 0 744 664 | 11/1996 | (EP) . |
| 06 196389 | 7/1994 | (JP) . |

Primary Examiner—Russell Adams
Assistant Examiner—Hung Henry Nguyen
(74) Attorney, Agent, or Firm—Walter Ottesen

(57) ABSTRACT

The invention is directed to an illuminating arrangement for a projection microlithographic apparatus having a laser 1 and an objective 2. Diffractive optical raster elements (8, 9) having a two-dimensional raster structure are mounted in the exit pupil and the object plane, respectively, of the objective 2 or in planes equivalent thereto. The illuminating arrangement provides an adapted increase of the light-conductance value and shapes the light beam, for example, into a circular shape, an annular shape or a quadrupole shape. The illuminating arrangement is suitable for combining with a zoom lens or an axicon objective 2 as well as with a glass rod 5.

29 Claims, 3 Drawing Sheets

ILLUMINATING ARRANGEMENT FOR A PROJECTION MICROLITHOGRAPHIC APPARATUS

RELATED APPLICATIONS

This is a continuation of application Ser. No. 08/658,605, filed on Jun. 5, 1996, now abandoned, which is a continuation-in-part application of U.S. patent application Ser. No. 08/355,157, filed Dec. 8, 1994, (now U.S. Pat. No. 5,646,715) and claiming priority of German utility model application G 94 09 744.5, filed Jun. 17, 1994, and German patent application 43 42 424.4, filed Dec. 13, 1993, as well as of U.S. patent application Ser. No. 08/658,605, filed Jun. 5, 1996, and claiming priority of German patent application 195 20 563.4, filed Jun. 6, 1995.

FIELD OF THE INVENTION

The invention relates to an illuminating arrangement for a projection microlithographic apparatus having a laser and an objective.

BACKGROUND OF THE INVENTION

Such an arrangement is shown, for example, in U.S. Pat. No. 5,675,401.

Lasers are primarily used as light sources for microlithography because they emit a very narrow band of light and, in the case of excimer lasers, light of very low wavelength in the deep ultraviolet range is emitted. The time-dependent and spatial coherence of these lasers as well as the small cross section and low divergence of the light beam are, however, not adapted to the situation for illuminating devices for microlithography.

Cross section and divergence cannot be changed independently by singular imaging optical elements in the cross section of the light beam as the light-conductance value cannot be increased. The light-conductance value is defined as the luminous flux divided by the luminance. In this context, reference can be made to the text of M. Young entitled "Optics and Lasers", Springer Verlag (1984), page 51 and the text of K. Mütze et al entitled "ABC der Optik" Verlag Dausien (1961), starting at page 477. The Lagrange invariant is closely related to the maintenance of the light-conductance value. In this connection, reference may be made to the text of M. Young cited above at pages 50 and 51.

Scattering elements are known to increase the light-conductance value. Frosted glass plates or quartz glass plates having statistically orientated microfaces, which act to refract, reflect or diffract, are used for this purpose. The scatter profile of such scattering plates is very intense in the center but also still distributes considerable energy at large angles in a tail portion of a distribution curve of the energy.

A targeted distribution of rays having divergence magnification and cross section magnification is obtainable with lens rasters which are available for the ultraviolet range and the DUV range (deep ultraviolet range).

Diffractive optical raster elements in quartz can be produced by photolithography in the most different embodiments and can be substituted for the raster lens plates.

U.S. Pat. No. 4,936,665 discloses a wafer illuminating system having a wafer stepper, projection objective, excimer laser, radiation forming optics and expansion optics and an illuminating system having several lens groups which, in turn, has an entry pupil. Two divergence generating elements are provided in the entry pupil and in a further plane. In contrast to the present invention, the second plane is likewise a pupillary plane and the two elements are stochastic scattering plates having scattering silicon crystallites. An oscillating mirror is additionally provided.

The foregoing functions to reduce the spatial coherence. The significance of the adaptation of the spatial coherence by magnification of the effective light source for wafer illuminating systems is described.

The two scattering plates cannot possess an anamorphotic effect. Zoom lens, axicon lens and glass rod are not described. A nonrastered diffractive optical element in the form of a blazed transmission grating having concentric multiplateau rings is provided in the pupil of the projection objective to correct aberrations of the wavefront.

SUMMARY OF THE INVENTION

It is an object of the invention to provide an illuminating arrangement of the kind described above which operates at high efficiency and has moderate complexity and which provides an illumination of the wafer with a suitable form of the light spot, divergence, coherence and homogeneity. It is another object of the invention to provide such an illuminating arrangement which is suitable for a wafer stepper as well as for a wafer scanner.

The illuminating arrangement of the invention is for a projection microlithographic apparatus and the arrangement includes: a laser for emitting a light beam along an optical axis; an objective mounted on the axis and having an object plane and an exit pupil plane; a first optical raster element mounted in a plane equivalent to said object plane; a second optical raster element mounted in a plane equivalent to said exit pupil plane; and, each of the optical raster elements having a two-dimensional raster structure.

Two planes are equivalent if they are related by one or more optical imagings within the arrangement, or if they are identical.

For an illuminating arrangement for a projection microlithographic apparatus having a laser and an objective, an optical raster element having a two-dimensional raster structure is arranged in the object plane and in the exit pupil of the objective or in planes equivalent thereto.

With these two raster elements arranged in this manner, the required divergence magnification of the laser light can be used in a targeted manner to form the light beam and to make possible the best degree of efficiency and a simplified configuration of further optical component groups.

BRIEF DESCRIPTION OF THE DRAWINGS

The invention will now be described with reference to the drawings wherein:

FIG. 2b is a cut-away portion of a two-dimensional arrangement of diffractive optical elements of FIG. 2a;

FIG. 3b shows an enlarged phase profile of the raster element of FIG. 3a;

DESCRIPTION OF THE PREFERRED EMBODIMENTS OF THE INVENTION

Figure 1:
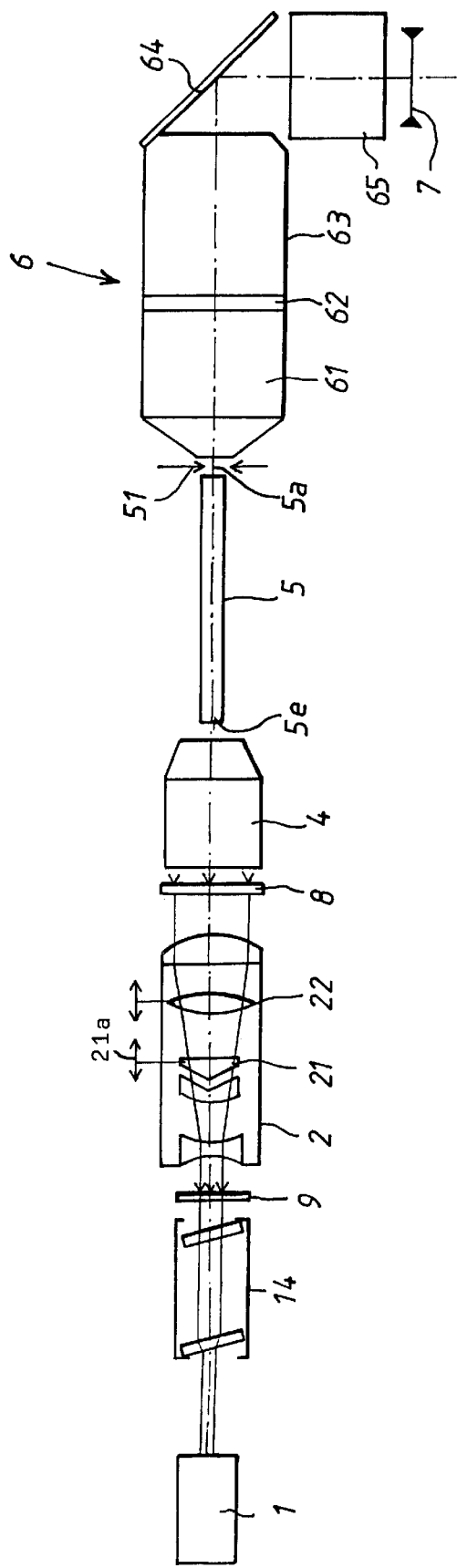
FIG. 1 is a schematic of an illuminating arrangement according to an embodiment of the invention.
Figure 4A:
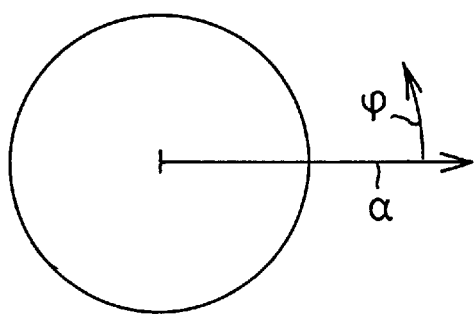
FIGS. 4a to 4c schematically show the divergence distribution downstream of the first optical raster of the illuminating arrangement of FIG. 1; and, FIG. 5 is a cut-away portion of a raster element of the illuminating arrangement of FIG. 1 and shows several refractive elements which make up the raster element.
Figure 4B:
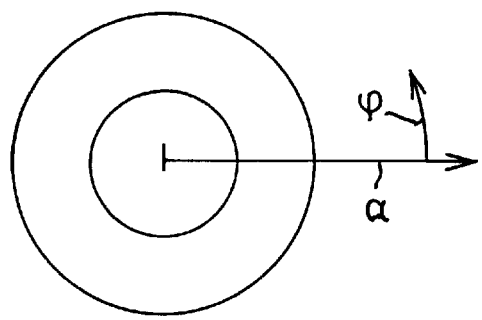
Figure 4C:
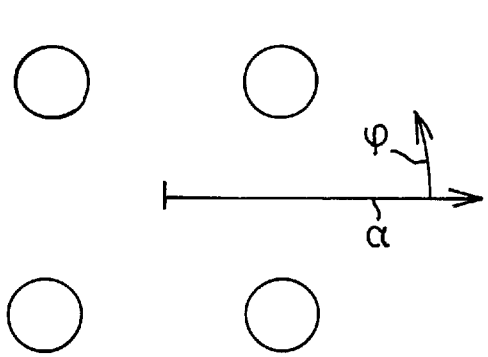

The illuminating arrangement shown in FIG. 1 is substantially a combination of FIG. 4d (laser 1 up to the second diffractive optical element 8) and FIG. 4c (the remainder up to reticle 7) of U.S. Pat. No. 5,675,401 and incorporated herein by reference. What is new here is the first diffractive optical element 9 and the coaction thereof with the second diffractive optical element 8 both shown in FIG. 1 herein.

The laser 1 is a KrF-excimer laser having a wavelength of 248 nm as shown in the above-mentioned U.S. Pat. No. 4,936,665 also incorporated herein by reference. This laser is conventionally used in the deep ultraviolet range.

A beam expander 14 functions to reduce coherence and magnifies the beam cross section to, for example, y=35±10 mm, x=10±5 mm, thereby providing a rectangular-shaped divergent distribution as seen in side elevation in FIG. 1. This beam expander can, for example, be a mirror arrangement as disclosed in U.S. Pat. No. 5,343,489 incorporated herein by reference.

A shutter can also be replaced by a corresponding pulse control of the laser 1.

The first diffractive optical raster element 9 is provided according to the invention and defines the object plane of an objective 2 having an exit pupil in which the second diffractive optical raster element 8 is provided.

An in-coupling optic 4 transmits the light to the entry face 5e of a glass rod 5 which mixes and homogenizes the light via multiple internal reflections. An intermediate field plane is disposed directly at the exit face 5a and a reticle-masking system (REMA) 51 is mounted in this plane. The reticle-masking system 51 defines an adjustable field diaphragm. The next-following objective 6 having lens groups (61, 63, 65), deflecting mirror 64 and pupillary plane 62 images the intermediate field plane of the reticle-masking system 51 on the reticle 7.

This illuminating system, a projection objective and an adjustable wafer holder conjointly define a projection exposure system for the microlithography of electronic components but also of optically diffractive elements and other microstructured components.

In a wafer stepper, the entire structured area corresponding to a chip is illuminated as uniformly as possible and as sharply as possible along the periphery. The structured area is generally a rectangle having a desired aspect ratio of, for example, 1:1 to 1:2 and especially 1:1.3.

A narrow strip is illuminated on the reticle 7 in a wafer scanner and the entire structured field of a chip is serially illuminated by scanning. The narrow strip is a rectangle having an aspect ratio of 1:2 to 1:8. Here too, the illumination is configured so that it is extremely uniform and sharp at the periphery (only in the direction perpendicular to the scanning direction).

Other forms of the illuminated area on the reticle 7 are possible in exceptional cases. The aperture of the reticle-masking system 51 and the cross section of the glass rod are precisely adapted to the required form.

The embodiment of the parts (especially the optical elements 8 and 9) arranged forward of the glass rod 5 are so selected that the entry aperture 5e is not only as homogeneous as possible but is illuminated with the highest possible degree of efficiency, that is, without significant light losses next to the entry aperture 5e.

For the foregoing, the following measures are carried out. The parallel light beam coming from the beam expander 14 has a rectangular cross section and a nonrotational symmetrical divergence of ($\theta x=1$ mrad, $\theta y=3$ mrad). This beam is changed by the first diffractive raster element 9 only so far with respect to divergence (that is, the light-conductance value and its shape) that an approximately circular distribution, annular distribution or quadrupole distribution results whereby the exit pupil (at the location of the second raster element 8) of the objective 2 is illuminated in the corresponding form. The numerical aperture of the first diffractive raster element 9 is, for example, NA=0.025.

FIGS 4a to 4c show the divergence distrubution downstream of the first optical raster 9 where the divergence angle $\alpha$ is given as a function of the azimuthal angle $\phi$ in a plane orthogonal to the optical axis with FIG. 4a showing a circular divergence distribution. FIG. 4b shows an annular divergence distribution and FIG. 4c shows a quadrupole divergence distribution.

The low divergence in the object plane of the objective 2 permits the objective to be configured with a small lens diameter and therefore economically and with excellent correction which is easily attainable as well as with a large zoom range. The lens cross section is well utilized by the light beam because of the rotational-symmetrical pupil. Only a numerical aperture of, for example, 0.025 of the objective 2, is required.

As disclosed in U.S. Pat. No. 5,675,401, the objective 2 is a zoom objective 22 having an integrated axicon-pair 21. The focal length lies in the range of 600 mm to 2000 mm with a threefold expansion range so that partially coherent illumination can be generated having the conventionally required values $0.3 \leq \delta \leq 0.9$. The pupil diameters at the second diffractive element 8 then lie at 50 mm to 100 mm.

Adapted annular aperture illuminations can be set by adjusting the axicon-pair 21 as indicated by arrow 21a. In addition, multipole illuminations and especially quadrupole illuminations can be generated with additional diaphragms or special pyramid forms of the axicon pair 21.

The objective 2 is simplified because of the low numerical aperture compared to the examples disclosed in U.S. Pat. 5,675,401, referred to above. In addition, the objective 2 is a condenser because the first raster element 9 as a secondary light source is disposed in a focal plane and the second raster element 8 is disposed in the beam path (image distance ∞) of collimated light. The light beam entering the objective 2 is also a beam of collimated light.

The second raster element 8 introduces a divergence of individual angular degrees to provide a rectangular distribution having an aspect ratio which corresponds to the aspect ratio of the entry face 5e of the glass rod 5, that is, for a wafer stepper of, for example, 1:1.3.

In this way, the generated divergence distribution in the pupillary intermediate plane is transmitted by the in-coupling optic 4 onto the entry face Se of the glass rod 5 as a field distribution which corresponds precisely to the form and size of the entry face 5e. The second optical element 8 is mounted in the pupillary intermediate plane.

Figure 2A:
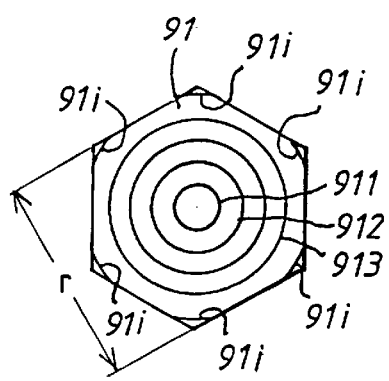
FIG. 2a is a schematic of a raster element of the first diffractive optical element as seen in plan view.
Figure 2B:
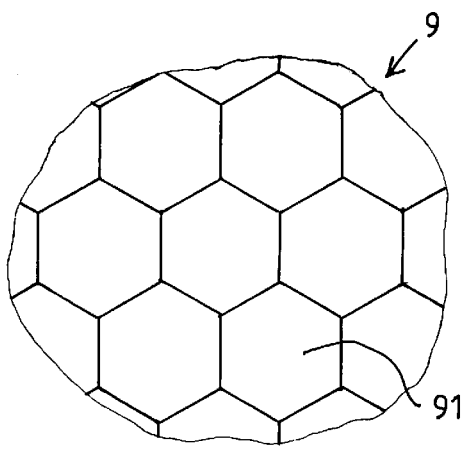

FIG. 2a shows a plan view of an element 91 of the two-dimensional raster and is an especially advantageous embodiment of the first raster element 9. The element 91 is hexagonal because the rotational-symmetrical divergence distribution to be generated can be best provided therewith. FIG. 2b shows a cut-away portion of a two-dimensional arrangement of the diffractive elements of 91 of FIG. 2a which define the raster element 9 shown in FIG. 1.

FIG. 2b shows a cut-away portion of a two-dimensional arrangement of the diffractive elements 91 of FIG. 2a which define the raster element 9 shown in FIG. 1.

The element 91 has a lateral dimension of typically r=1 mm. The elements 91 are assembled in honeycomb fashion to form the two-dimensional raster element 9. The diffraction pattern resulting therefrom has the periodicity $\lambda/r = 2.48 \cdot 10^{-4}$ corresponding to an angle of 0.014° with the laser wavelength $\lambda$=248 nm. Disturbances caused by interference patterns do not arise because the incoming laser beam has a spatial coherence of under 1 millimeter and a divergence greater by orders of magnitude.

The element 91 of the raster is a diffracting concave Fresnel lens. It has eight annularly-shaped steps 911 to 914 with a thickness of $(\pi/4)\cdot\lambda$. The Fresnel lens is produced by photolithography and etching with a minimum structural width of 1 $\mu$m.

The aperture of element 91 is only NA=0.025. A multiplicity of elements 91 is assembled to a rectangular diffractive optical raster element 9 which covers the entire cross-sectional area of the incoming laser beam. The diffraction efficiency is above 80%.

The radial intensity distribution achieved thereby in the exit pupil of the objective 2 (that is, at the location of the second diffracting optical raster element 8) very closely approximates a rectangular function viewed as a cross section. The edge drop off is continuous and steep with 50% points at more than a multiple of 0.9 (especially greater than a multiple of 0.95) of the width. The course of the intensity therebetween is very homogeneous and a rotational-symmetrical ripple is at under ±5% and is dependent upon the spatial coherence and the divergence of the laser 1.

Figure 3A:
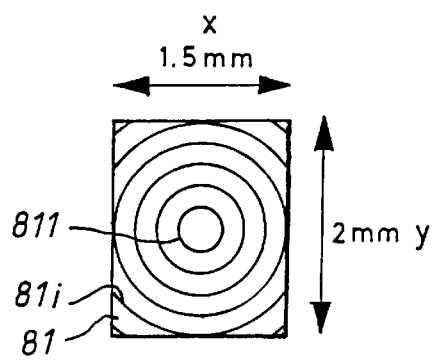
FIG. 3a is a schematic plan view of a raster element of the second diffractive optical element.

The second diffractive optical raster element 8 is a plate having a diameter of 50 to 100 mm with a very strong anamorphotic effect. The raster element 8 is built up of two-dimensional rectangular elements 81 which are placed one next to the other with the elements 81 having a rotational-symmetrical structure. One element 81 is shown schematically in plan view in FIG. 3a. The side ratio x/y corresponds to the aspect ratio of the entry face 5e of the glass rod 5 and of the area illuminated on the reticle 7. This area is here x=1.5 mm, y=2 mm. The data provided above for element 91 apply also here for the size of element 81. The number of the elements 81 is so high that an adjustment of the degree of coherence $\sigma$ from 0.3 to 0.9 remains without disturbing effects.

Figure 3B:

The elements 81 too are diffracting Fresnel lens elements having a negative focal length of approximately –10.5 mm. The elements 81 are produced as gray-tone lenses having a continuous thickness course from 0 to $6\pi\cdot\lambda$ in three rings 811 to 81i as shown in FIG. 3b. FIG. 3b is an enlarged cross section through FIG. 3a in the x-direction and shows a quasi-continuous structural Fresnel lens from which a plurality of the elements shown in FIG. 2b are joined to form the entire lens array (Fresnel lens).

The generated divergence lies at 0.50° to 70° with an x/y aspect ratio corresponding to the aspect ratio of the entry face 5e of the glass rod 5.

Figure 3C:
FIG. 3c shows a phase profile of an alternate binary diffractive optical element.

Alternatively, the elements 81 can be configured as binary diffractive phase profile lenses as shown in the cross section of FIG. 3c, that is, there are only projections 821 to 82i present of uniform elevation $\pi\cdot\lambda$ but of different widths and with different spacing as diffracting structures present. The advantage of smaller etching depths is countered by the problem of smaller structural widths.

The entire second diffractive optical raster element 8 in the arrangement of FIG. 1 effects a homogeneous intensity distribution at the entry face 5e of the glass rod 5. In both x and y directions, this intensity distribution is an approximate rectangular function having an edge slope and waviness in the plateau region as does the intensity distribution on the entry side of the raster element 8 which is shaped by the first diffractive raster element 9.

Figure 5:
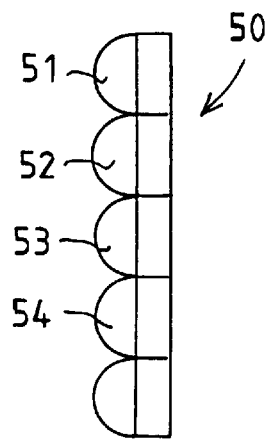

FIG. 5 shows a detail cut-away portion of an embodiment of a raster element corresponding to the raster elements 8 or 9 made up of a plurality of refractive elements 51 to 54.

A very high radiation load of the following optical system (especially the glass rod) is possible with this uniform intensity distribution because all material cross sections are irradiated uniformly and without damaging intensity peaks.

Refractive lens rasters of ultraviolet resistant material such as quartz can be used as an alternative to the diffractive optical raster elements shown in the example.

It is understood that the foregoing description is that of the preferred embodiments of the invention and that various changes and modifications may be made thereto without departing from the spirit and scope of the invention as defined in the appended claims.

What is claimed is:

1. An illuminating arrangement for a projection microlithographic apparatus, the arrangement comprising:
    a laser for emitting a light beam along an optical axis;
    an objective mounted on said axis and having an object plane and an exit pupil plane;
    a first optical raster element mounted in said object plane;
    a second optical raster element mounted in said exit pupil plane;
    each of said optical raster elements having a two-dimensional raster structure; and,
    a light-mixing element mounted downstream of said second optical raster element.

2. The illuminating arrangement of claim 1, said second optical raster element being mounted downstream of said first raster element and in the exit pupil plane.

3. The illuminating arrangement of claim 2, said second optical raster element being structured to increase divergence by at least a factor of two.

4. The illuminating arrangement of claim 1, the rays of said light beam emitted by said laser having a rectangular-shaped divergence distribution; and, said first optical raster element being structured to convert said rectangular-shaped divergence distribution into a divergence distribution downstream of said first optical raster element which has a geometric configuration corresponding to one of the following: circular, annular and quadrupole.

5. The illuminating arrangement of claim 1, said second raster element being structured to generate divergence dependent upon direction.

6. The illuminating arrangement of claim 5, wherein the downstream divergence distribution of said first optical raster element is so narrow that said objective requires a numerical aperture of less than 0.3.

7. The illuminating arrangement of claim 1, wherein the downstream divergence distribution of said first raster optical element is so narrow that said objective requires a numerical aperture of less than 0.01.

8. The illuminating arrangement of claim 1, said second optical raster element being structured to anamorphotically convert said divergence distribution so as to cause the field illuminated by said illuminating arrangement to be rectangular.

9. The illuminating arrangement of claim 8, wherein said rectangular illuminated field has an aspect ratio in the range of 1:1 to 1:2.

10. The illuminating arrangement of claim 8, wherein said rectangular illuminated field has an aspect ratio in the range of 1:2 to 1:8.

11. The illuminating arrangement of claim 1, said objective being a zoom objective.

12. The illuminating arrangement of claim 1, said objective including an adjustable axicon for selectively generating a ring-shaped illumination.

13. The illuminating arrangement of claim 12, said objective including a displaceable lens mounted on said axis in spaced relationship to said axicon; and, said displaceable lens and said axicon being adjustable independently of each other.

14. The illuminating arrangement of claim 1, further comprising: a homogenizing glass rod being disposed downstream of said second optical raster element; an additional objective arranged on said axis between said second optical raster element and said glass rod for coupling the light of said light beam into said glass rod; and, said glass rod having a cross section adapted to the aspect ratio of the illuminated field of said illuminating arrangement.

15. The illuminating arrangement of claim 1, further comprising a mirror arrangement interposed between said laser and said first. optical raster element for expanding the cross section of said light beam and for reducing the coherence of the illumination.

16. The illuminating arrangement of claim 1, one of said optical raster elements comprising a two-dimensional arrangement of diffractive elements.

17. The illuminating arrangement of claim 16, said one optical raster element comprising a multiplicity of phase-step Fresnel lenses arranged in a raster.

18. The illuminating arrangement of claim 17, wherein said raster has a raster scale in the order of magnitude of 1 mm.

19. The illuminating arrangement of claim 17, said Fresnel lenses being arranged with two-dimensional periodicity in said raster except for a nonperiodic phase shift.

20. The illuminating arrangement of claim 16, said optical raster elements being diffractive elements which are binary optical elements.

21. The illuminating arrangement of claim 16, said optical raster elements being diffractive elements having structure widths in a range of 0.5 $\mu$m to 1.5 $\mu$m.

22. The illuminating arrangement of claim 16, said one optical raster element comprising a multiplicity of quasi-continuously structured Fresnel lenses arranged in a raster.

23. The illuminating arrangement of claim 22, wherein said Fresnel lenses are gray-tone Fresnel lenses.

24. The illuminating arrangement of claim 1, one of said optical raster elements having a negative focal length.

25. The illuminating arrangement of claim 1, one of said optical raster elements comprising an array of refractive micro lenses.

26. The illuminating arrangement of claim 25, said micro lenses being Fresnel lenses.

27. The illuminating arrangement of claim 1, said first optical raster element being structured to provide a circular light distribution, an annular light distribution or a quadrupole light distribution.

28. The illuminating arrangement of claim 1, one of said optical raster elements being structured to increase the light-conductance value.

29. An illuminating arrangement for a projection microlithographic apparatus, the arrangement comprising:

a light source including a laser providing a substantially diffraction-limited parallel light beam along an optical axis;

a first diffractive optical raster element mounted on said optical axis downstream of said light source;

a zoom objective mounted on said optical axis downstream of said first diffractive optical raster element and having a variable axicon pair;

a second diffractive optical raster element mounted on said optical axis downstream of said zoom objective;

an in-coupling optic mounted on said optical axis downstream of said second diffractive optical raster element;

a glass rod light-mixing element mounted on said optical axis downstream of said in-coupling element; and, an optical assembly mounted on said optical axis downstream of said glass light-mixing element and including a reticle masking system and an objective.

* * * * *

UNITED STATES PATENT AND TRADEMARK OFFICE
CERTIFICATE OF CORRECTION

PATENT NO. : 6,285,443 B1
DATED : September 4, 2001
INVENTOR(S) : Johannes Wangler and Gerhard Ittner Page 1 of 1

It is certified that error appears in the above-identified patent and that said Letters Patent is hereby corrected as shown below:

Column 4,
Line 15, delete "distrubution" and substitute -- distribution -- therefor.
Line 36, delete "diffractive" and substitute -- raster -- therefor.
Line 58, delete "Se" and substitute -- 5e -- therefor.
Line 67, delete line 67.

Column 5,
Lines 1 and 2, delete lines 1 and 2.

Column 6,
Lines 60 and 61, delete "raster optical" and substitute -- optical raster -- therefor.
Line 62, delete "0.01" and substitute -- 0.1 -- therefor.

Column 7,
Line 27, delete "first." and substitute -- first -- therefor.

Signed and Sealed this

Sixteenth Day of April, 2002

Attest:

JAMES E. ROGAN
Attesting Officer
Director of the United States Patent and Trademark Office